United States Patent
Pevzner et al.

(10) Patent No.: US 11,470,725 B2
(45) Date of Patent: Oct. 11, 2022

(54) METHOD FOR FABRICATING Z-AXIS VERTICAL LAUNCH

(71) Applicant: RAYTHEON COMPANY, Waltham, MA (US)

(72) Inventors: Mikhail Pevzner, Woburn, MA (US); James E. Benedict, Lowell, MA (US); Andrew R. Southworth, Lowell, MA (US); Thomas V. Sikina, Acton, MA (US); Kevin Wilder, Derry, NH (US); Matthew Souza, North Easton, MA (US); Aaron Michael Torberg, East Waterboro, ME (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/395,977

(22) Filed: Aug. 6, 2021

(65) Prior Publication Data
US 2021/0368629 A1   Nov. 25, 2021

Related U.S. Application Data

(62) Division of application No. 16/541,789, filed on Aug. 15, 2019, now Pat. No. 11,109,489.

(51) Int. Cl.
*H05K 3/10* (2006.01)
*B21F 11/00* (2006.01)

(52) U.S. Cl.
CPC .............. *H05K 3/103* (2013.01); *B21F 11/00* (2013.01); *H05K 2203/0195* (2013.01); *H05K 2203/0228* (2013.01); *H05K 2203/049* (2013.01)

(58) Field of Classification Search
CPC ........... H05K 3/103; H05K 2203/0195; H05K 2203/0228; H05K 2203/049;
(Continued)

(56) References Cited

U.S. PATENT DOCUMENTS

| 3,516,156 A | 6/1970 | Steranko |
| 4,125,136 A | 11/1978 | Olcese et al. |

(Continued)

FOREIGN PATENT DOCUMENTS

| DE | 2261281 A1 | 6/1974 |
| EP | 0457920 A1 | 11/1991 |

OTHER PUBLICATIONS

International Search Report and Written Opinion of International Patent Application No. PCT/US2020/045908 dated Nov. 16, 2020.

*Primary Examiner* — Donghai D Nguyen
(74) *Attorney, Agent, or Firm* — Lando & Anastasi, LLP

(57) ABSTRACT

An apparatus for automating the fabrication of a copper vertical launch (CVL) within a printed circuit board (PCB) includes a feed mechanism to feed and extrude copper wire from a spool of copper wire and a wire cutting and gripping mechanism to receive copper wire from the feed mechanism, cut and secure a segment of copper wire, insert the segment of copper wire into a hole formed within the PCB, solder an end of the segment of copper wire to a signal trace of the PCB, and flush cut an opposite end of the segment of the copper wire to a surface of the PCB. The wire cutting and gripping mechanism includes a wire cutter to flush cut the segment of copper wire and an integrated heated gripper device to receive the copper wire from the spool of copper wire and cut and grab a segment from copper wire.

8 Claims, 8 Drawing Sheets

(58) Field of Classification Search
CPC ......... H05K 2203/1446; H05K 3/4046; H05K 2201/0376; H05K 2201/10287; B21F 11/00; Y10T 29/49147; Y10T 29/49149
USPC .................................................. 29/842, 843
See application file for complete search history.

(56) References Cited

U.S. PATENT DOCUMENTS

| | | | |
|---|---|---|---|
| 4,361,174 A | | 11/1982 | Jenkins et al. |
| 5,482,092 A | * | 1/1996 | Van Zeeland ............ H05K 7/06 140/92.1 |
| 6,712,261 B2 | * | 3/2004 | Hall ..................... H05K 3/4046 228/180.5 |
| 6,747,217 B1 | | 6/2004 | Jochym et al. |
| 8,601,683 B2 | | 12/2013 | Cohn et al. |
| 10,617,013 B2 | | 4/2020 | Ishikawa |
| 2005/0150682 A1 | | 7/2005 | Cohn et al. |
| 2019/0150296 A1 | | 5/2019 | Southworth et al. |

* cited by examiner

METHOD FOR FABRICATING Z-AXIS VERTICAL LAUNCH

CROSS REFERENCE TO RELATED APPLICATIONS

This application claims priority under 35 U.S.C. § 121 as a division of U.S. patent application Ser. No. 16/541,789, titled "AN APPARATUS FOR FABRICATING Z-AXIS VERTICAL LAUNCH WITHIN A PRINTED CIRCUIT BOARD," filed Aug. 15, 2019, which is incorporated by reference herein in its entirety for all purposes.

GOVERNMENT RIGHTS

Not applicable.

BACKGROUND

Radio frequency (RF) and electromagnetic circuits may be manufactured using conventional printed circuit board (PCB) processes. Some RF and electromagnetic circuits may include power dividers (power splitters) and combiners, for example, to distribute a signal to many elements, such as radiator elements of an antenna array for beam forming, and/or to combine multiple signals from the elements into one signal. Conventional PCB manufacturing processes may include lamination, electroplating, masking, etching, and others, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace dimensions, thereby limiting the range of highest frequency signals that may be supported by such devices.

The advanced/additive manufacturing technology (AMT) approach is a hybrid additive, subtractive, and conventional approach that removes the plating process used to form interconnections in conventional PCB manufacturing processes. The process uses two main items to allow the process to work, Faraday walls and copper vertical launch (CVL). A Faraday wall is a shielding component that relies on a channel that is first milled from the dielectric material, and then a conductive paste is dispensed into the trench. CVL relies on a soldered copper wire interface to form an interconnection between two different layers of a circuit board. Automation of both the processes would remove the plating approach from a printed circuit board process.

Presently, copper vertical launches or CVLs are created by cutting copper wire by hand, with the cutters being oriented in a way that allows a flat cut on one side, then turned the other way to make a flat cut on the other side. There is no automated way to prepare both sides of copper wire interfaces for a strong solder joint and to install this interconnect. Other methods include wire extrusion which can be performed by specialized equipment such as modified 3D printers, that are not the most well-known and usually only exist in lab spaces. Solder reflow can be implemented by using a soldering iron, for example. The closest mechanism to creating a solder joint in CVLs is in wire bonding applications.

SUMMARY OF THE DISCLOSURE

One aspect of the present disclosure is directed to an apparatus for automating the fabrication of a copper vertical launch (CVL) within a printed circuit board (PCB). In one embodiment, the apparatus comprises a feed mechanism configured to feed and extrude copper wire from a spool of copper wire and a wire cutting and gripping mechanism configured to receive copper wire from the feed mechanism, cut and secure a segment of copper wire, insert the segment of copper wire into a hole formed within the PCB, solder an end of the segment of copper wire to a signal trace of the PCB, and flush cut an opposite end of the segment of the copper wire to a surface of the PCB.

Embodiments of the apparatus further may include the wire cutting and gripping mechanism having a wire cutter configured to flush cut the segment of copper wire and an integrated heated gripper device to receive the copper wire from the spool of copper wire and cut and grab a segment from copper wire. The wire cutter may be mounted on a slide, which is used to position the wire cutter below the wire gripper assembly. The wire gripper assembly may include a pair of gripper jaws and an inverted wire cutter that are used to grip and cut the copper wire, respectively, with the wire feed mechanism being configured to deliver an end of the copper wire into the gripper jaws. The inverted wire cutter may be configured to cut the copper wire from the spool of copper wire to create the segment of copper wire, and retract the segment of copper wire into a wire guide of the wire gripper assembly. The wire gripper assembly further may include a vacuum device or plenum that has a channel formed there in to channel waste generated from cutting the copper wire during a trimming operation. The vacuum device may be connected to a vacuum source to provide the suction required to move the waste. The feed mechanism may include a post configured to receive the spool of copper wire. The feed mechanism further may include a guide, a set of pinch rollers configured to pinch or grab the copper wire, and another guide connected to a flexible tube. The arrangement is such that copper wire from the spool of wire is fed through the guide, between the pinch rollers, and into the second guide connected to the flexible tube. The wire cutting and gripping mechanism may include a wire guide located at an end of a force sensing gripper assembly, with the wire guide having a diameter that is slightly greater than the diameter of the copper wire being fed into the wire guide. The feed mechanism further may include a stepper motor that drives a gear to feed the copper wire. The apparatus further may include a PCB reflow pre-heater mechanism configured to reflow solder once the copper wire is inserted into the hole of the PCB. The pre-heater mechanism further may include a hot plate configured to raise a temperature of the PCB to just under a reflow temperature.

Another aspect of the disclosure is directed a method of automating the fabrication of a copper vertical launch (CVL) within a printed circuit board (PCB). In one embodiment, the method comprises: feeding copper wire to a wire cutting and gripping mechanism; cutting and securing a segment of copper wire; inserting the segment of copper wire into a hole formed within the PCB; soldering an end of the segment of copper wire to a signal trace of the PCB; and flush cutting an opposite end of the segment of the copper wire to a surface of the PCB.

Embodiments of the method further may include receiving copper wire from a spool of copper wire. The method further may include removing waste generated from cutting the copper wire during a trimming operation. Removing waste may include a vacuum device or plenum that has a channel formed there in to channel waste and a vacuum source to provide the suction required to move the waste. Feeding copper wire may include guiding the copper wire with a set of pinch rollers configured to pinch or grab the copper wire, and another guide connected to a flexible tube. The method further may include heating the PCB with a PCB reflow pre-heater mechanism configured to reflow solder once the copper wire is inserted into the hole of the PCB.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION

Figure 1A:
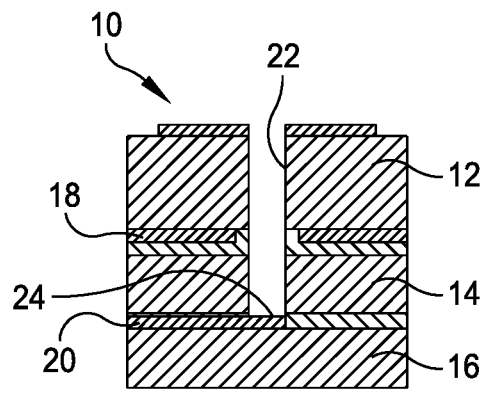
FIGS. 1A and 1B are cross-sectional views of a portion of a printed circuit board (PCB) showing process steps of creating a copper vertical launch (CVL)

Various aspects and embodiments are directed to compact, low profile electromagnetic circuits, and improved methods of manufacture of the same, that allow for small sizes and higher frequencies than conventional systems and methods. Aspects and examples described provide examples of fabricating copper vertical launches (CVLs) within a printed circuit board (PCB) that advantageously apply additive and subtractive manufacturing techniques to provide low-cost, automated fabrication. Manufacturing processes described herein may be particularly suitable for fabrication of such circuit structures having small circuit features capable of supporting electromagnetic signals in the range of 8 to 75 GHz or more, potentially up to 300 GHz or more using suitable subtractive (e.g., milling, drilling) and additive (e.g., 3-D printing, filling) manufacturing equipment. Electromagnetic circuit structures in accord with systems and methods described herein may be particularly suitable for application in 28 to 70 GHz systems, including millimeter wave communications, sensing, ranging, etc. Aspects and embodiments described may also be suitable for lower frequency applications, such as in the S-band (2-4 GHz), X-band (8-12 GHz), or others. These frequencies would include Ka-Band (26.5 to 40 GHz), V-Band (40-75 GHz) and W-Band (75-110 GHz) phased array systems.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accord with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein. As mentioned above, the reactive beamformer of embodiments of the present disclosure is particularly suited to millimeter-wave frequencies.

The methods and apparatuses described herein may support smaller arrangements and dimensions than conventional processes are capable. Such conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, and at lower cost.

Electromagnetic circuits and methods of manufacture in accord with those described herein include various additive manufacturing techniques to produce electromagnetic circuits and components capable of handling higher frequencies, with lower profiles, and at reduced costs, cycle times, and design risks, than conventional circuits and methods. Examples of techniques include milling of conductive material from a surface of a substrate to form signal traces or apertures of significantly smaller dimensions than allowed by conventional PCB processes, milling of one or more substrates to form a trench, using 3-dimensional printing techniques to deposit printed conductive inks into the trench to form a Faraday wall (a continuous electric barrier, as opposed to a series of ground vias with minimum spacing therebetween), "vertical launch" signal paths formed by milling (drilling) a hole through a portion of substrate and in which a wire is placed (and/or conductive ink is printed), to make electrical contact to a signal trace disposed on a surface of the substrate (or an opposing substrate), which may include forming a Faraday wall around the vertical launch conducting wire (which may be copper in some embodiments), and using 3-dimensional printing techniques to deposit printed resistive inks to form resistive components. Any of the above example techniques and/or others (e.g., soldering and/or solder reflow), may be combined to make various electromagnetic components. Aspects and examples of such techniques are described and illustrated herein with respect to a radio frequency interconnect to convey an electromagnetic signal to or from a layer of an electromagnetic circuit, but the techniques described may be used to form various electromagnetic components, connectors, circuits, assemblies, and systems.

Integrated Z-Axis Copper Vertical Launch Installation Apparatus

In one embodiment, a system and method of extruding copper wire to specified lengths, for the purpose of Z-axis interconnections in PCBs is shown and described herein. Advanced/additive manufacturing technology (AMT) is utilized to enable copper wire to replace electroplated vias in PCBs. In one embodiment, a hole is drilled from the top of the PCB to a pad, e.g., a copper pad, on an internal layer of the PCB. The pad is pre-tinned with solder to enable a soldered connection between the wire and the pad during reflow. The wire is inserted and reflowed between the layers to create the connection.

Figure 1B:
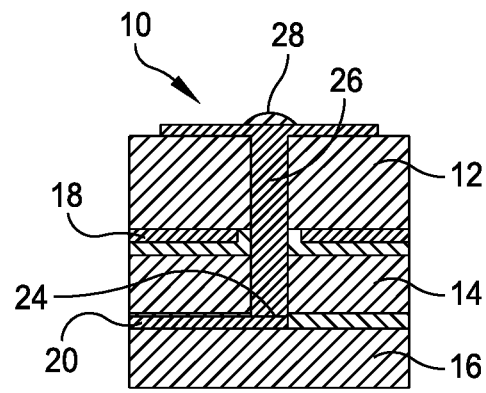

FIGS. 1A and 1B illustrate such a process. As shown in FIG. 1A, a portion of a multilayer PCB generally indicated at 10 includes three dielectric layers 12, 14, 16 separated by copper layers or traces 18, 20, respectively. A hole 22 is drilled through the PCB 10 from the top of the PCB through dielectric layer 12, copper layer 18, and dielectric layer 14 to a pad 24 created by copper trace 20 provided on an internal layer of the PCB. In another embodiment, a hole can be formed by stacking layers with holes pre-drilled ahead of time, prior to board lamination. In one embodiment, the pad is pre-tinned with solder to provide a solder connection when reflowed. As shown in FIG. 1B, a copper wire 26 is inserted into the hole 22 so that an end of the copper wire touches the pad 24. The PCB 10 is heated to a reflow temperature in which the wire 26 is connected to the pad 24 and the conductive trace 20. As shown in 1B, solder material 28 may be deposited on top of the copper wire 26 to secure a component to the PCB, for example.

Figure 2:
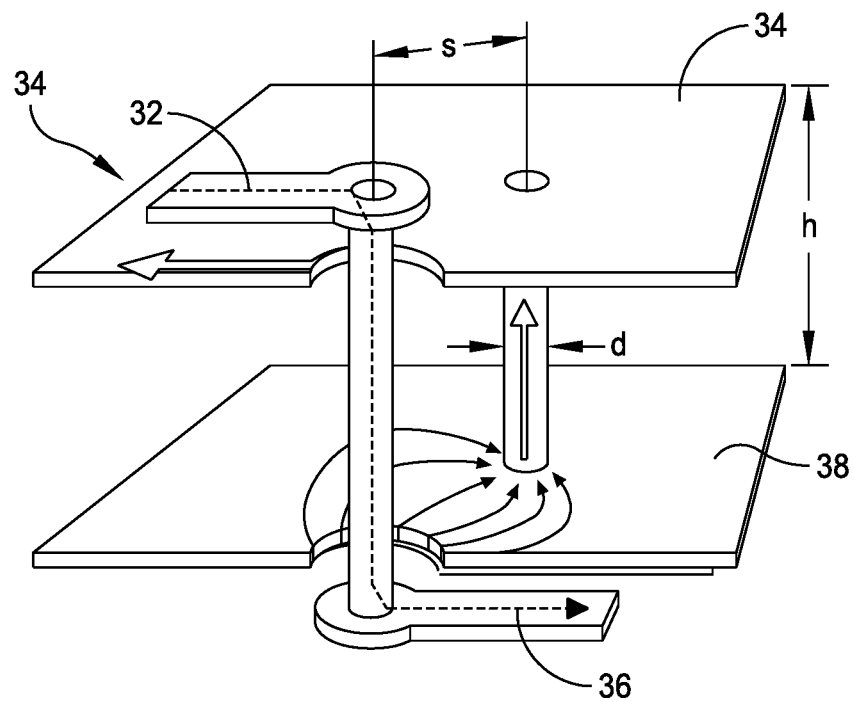
FIG. 2 is a perspective view of an assembled CVL used to connect two trace signals.

Referring to FIG. 2, a Z-axis interconnection generally indicated at 30 is shown and described. As shown, the Z-axis interconnection 30 provides connection between a signal trace 32 provided on an upper surface of a top dielectric layer 34 and a signal trace 36 provided on a lower surface of a bottom dielectric layer 38, which may be internal within a PCB, for example. The Z-axis interconnection 30 can be fabricated by employing the systems and methods described herein.

There is no integrated approach to installing CVL Z-axis interconnections on AMT RF CCAs in a production setting. Current fabrication techniques are performed in a lab setting manually, and present automation approaches in the lab are somewhat ad-hoc and do not integrate all processes into one setup, capable of producing consistent results in volume. Recently, automation techniques have been applied to allow limited quantities of CVLs to be produced automated in a laboratory setting. Previously, such CVLs were built by hand, which is labor intensive and costly.

Figure 3:
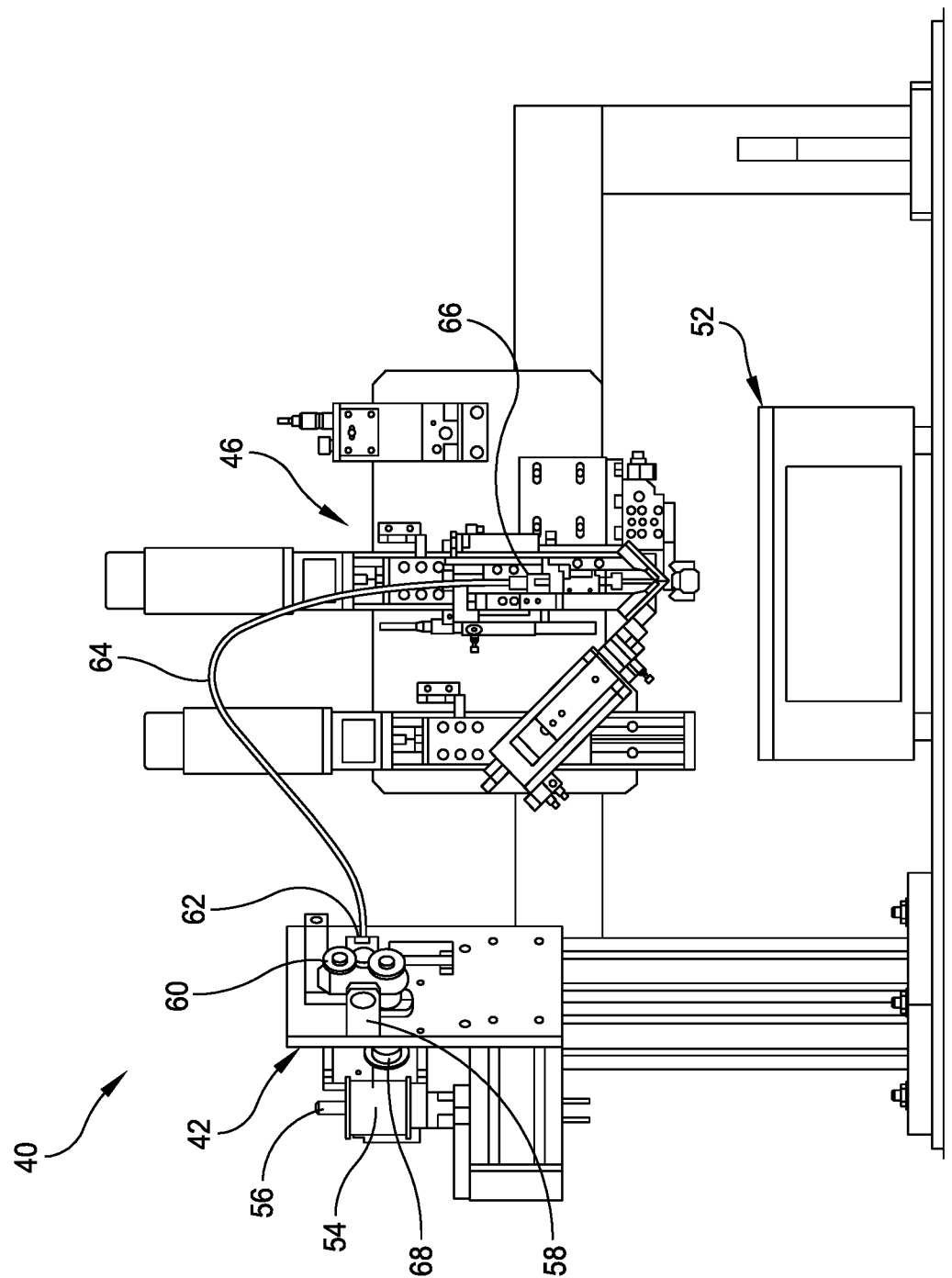
FIG. 3 is a side elevational view of an integrated Z-axis CVL installation apparatus of an embodiment of the present disclosure.

Systems and methods of embodiments of the present disclosure enable an integrated and automated approach to installing the CVL installation by integrating the following devices and processes. Referring to FIG. 3, an apparatus, generally indicated at 40, is provided to fabricate CVLs within a PCB. In one embodiment, the apparatus 40 includes a mechanism, generally indicated at 42, to feed and extrude copper wire from a spool of copper wire. The apparatus 40 further includes a wire cutting and gripping mechanism, generally indicated at 46, with a debris removal feature to enable perfectly flat terminations on both sides of the wire interconnect when processed, which is critical to achieving a good solder joint connection between the copper wire and the pad. The dual wire cutting and gripping mechanism 46 includes a wire cutter configured to flush cut the copper wire and an integrated heated gripper device to receive the copper wire from the spool of wire and cut and grab (secure) a segment from copper wire that is used to form and create a solder joint formation internal to the printed circuit board. The apparatus 40 further includes a PCB reflow pre-heater mechanism, generally indicated at 52, to reflow the solder once the copper wire is inserted into the hole of the PCB. Embodiments of the systems and methods described herein create a strong and compliant Z-axis interconnection and enables automation on production-grade equipment.

The apparatus 40 enables the automated assembly of CVLs into PCBs, and drastically reduces the labor time and cost while increasing the yield and reliability of the connection.

The apparatus 40 can be integrated into an additive manufacturing solution to add the capability of embedding conductive copper wires into 3D printed parts, a concept that is not available on the additive market. Moreover, the systems and methods disclosed herein enable rapid prototyping and enable the AMT process to be performed on a larger scale and much more quickly. The Z-Axis interconnections eliminate the need for "wet" plating process or other applications where a solder joint has to be reflowed internal to another assembly thereby providing a "dry" process. The apparatus and associated method enable copper wire to be extruded to specified lengths, for the purpose of creating Z-Axis interconnections in PCBs. Such AMT process technologies enable the copper wire to replace electroplated vias in PCBs.

The systems and methods described herein embody an automated apparatus 40 that feeds a wire into hole in PCB, solders the wire to a pad internal to the PCB, and then cuts the wire at a top surface of the PCB. This process solves the problem of having to manually perform the cutting and heating/reflow operations, which are not sustainable or feasible for production in volume.

Automated Wire Extrusion Mechanism for Z-Axis Interconnections

Embodiments of the present disclosure are directed to systems and methods of extruding copper wire to specified lengths, for the purpose of Z-Axis interconnections in PCBs. The system that would execute this process effectively places wires between layers in a PCB. The system includes stepper motors, which are used to drive a gear or toothed bearing, which in turn drives the copper wire in a controlled manner to a specified length. As described herein, an integrated cutting and gripping mechanism trims the wire to length and squares the ends of the wire before and after each cut. In one embodiment, the system is mounted on a CNC gantry system for the automated placement of the CVLs within a PCB.

Referring to FIG. 3, in one embodiment, the mechanism 42 for feeding and extruding wire includes a wire feed system having a spool 54 of copper wire provided on a post 56. The mechanism 42 further includes a guide 58, a set (two) of pinch rollers together indicated at 60 configured to pinch or grab the copper wire, and another guide 62 connected to a flexible tube 64. The arrangement is such that copper wire from the spool 54 of wire is fed through the guide 58, between the pinch rollers 60, and into the second guide 62 connected to the flexible tube 64. In a certain embodiment, the tube 64 is fabricated from Teflon® material to enable the copper wire to slide easily through the tube. The wire feed system is configured to pinch the copper wire, and feed the wire down the tube 64 to a carbide wire guide 66 associated with the cutting and gripping mechanism 46, which will be described in greater detail below. This wire guide 66 has a diameter that is slightly greater than the diameter of the copper wire being fed into the wire guide. In one embodiment, the wire guide 66 has a diameter that is 0.002 inches larger than a diameter of the copper wire.

This approach enables the automated assembly of CVLs into PCBs and drastically reduces the labor time while increasing the yield and reliability of the connection. In addition, the wire feed system of the mechanism 42 can be modified and made more generic as a mechanism configured to feed and extrude wire between any two generic locations, not necessarily in a PCB. The mechanism 42 can be integrated into an additive manufacturing solution to add the capability of embedding conductive copper wires into 3D printed parts, a concept that is not presently available on the additive market.

Figure 4A:
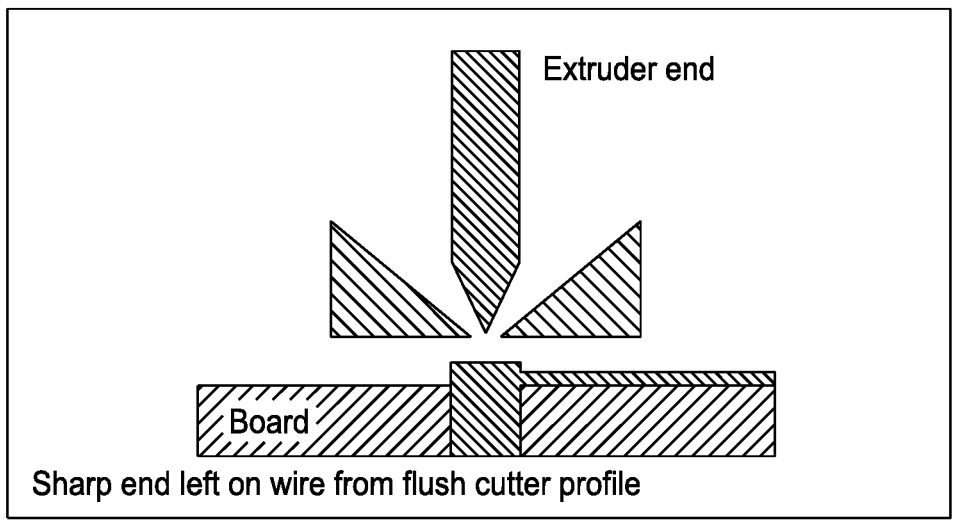
FIGS. 4A-4C are schematic views showing a sequence of extruding copper wire and cutting the copper wire.
Figure 4B:
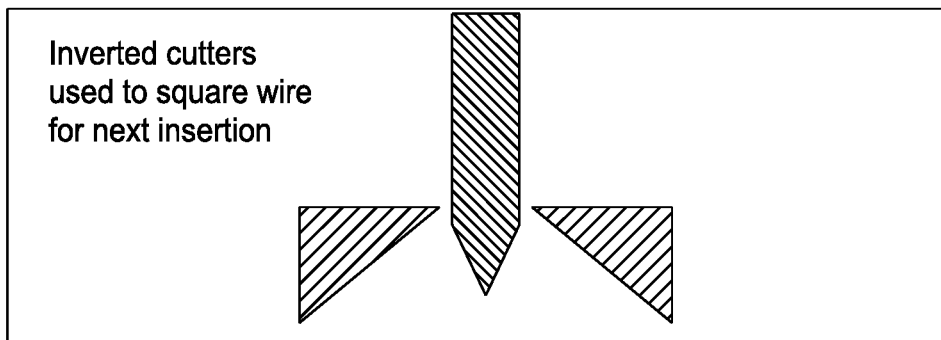
Figure 4C:
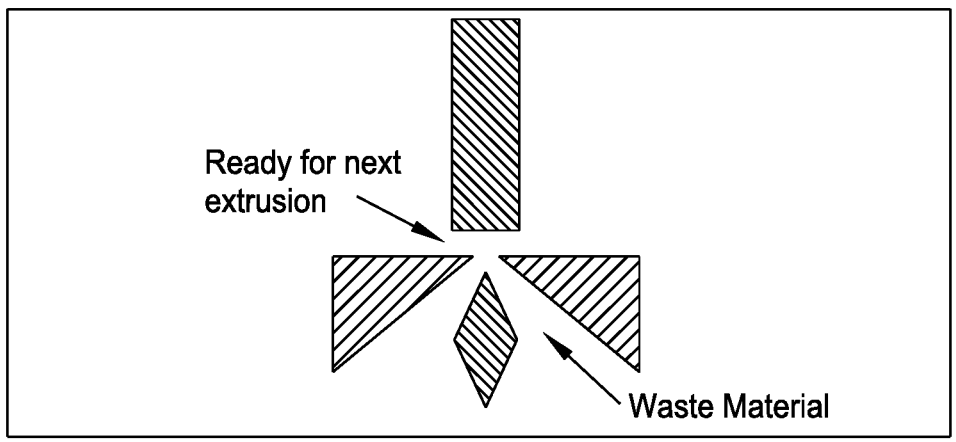

In one embodiment, the mechanism 42 further includes a stepper motor 68 that drives a gear which extrudes or otherwise feeds the copper wire. Stepper rotation is used (potentially in collaboration with sensors for feedback on extrusion distance) to correlate distance extruded. Once copper wire is driven to length, automatic flush cutters trim the wire, which will be described in greater detail below. In one embodiment, a second set of cutters are used to cut the wire from the spool of wire and grab the cut section of wire. In another embodiment, the flush cutters are then flipped to flush cut the wire again in preparation for the next wire insertion. This process is illustrated sequentially in FIGS. 4A-4C. FIG. 4A illustrates a wire cutter being used to cut excess material from a processed PCB. FIG. 4B illustrates a second wire cutter or an inverted wire cutter being used to cut an end of wire being used for the next CVL. FIG. 4C illustrates the end of the wire after being cut by the inverted wire cutter, with excess material being vacated from the area by a vacuum device.

An integrated sensor can be employed to provide a feedback loop to track and control wire dispensing. Other types of motor drivers, and methods of gripping the wire for extrusion can be provided.

Dual Wire Cutting and Gripping Mechanism for Z-Axis Interconnections

Known approaches employed to prepare a copper wire to create a Z-axis interconnection use a single wire cutter that typically produces an uneven and pointed end, resulting in poor soldering joints that affect mechanical and electrical performance of the assembly. Presently, the wire is cut by hand and the cutters are oriented in a way that allows a flat cut on one side, then turned the other way to make a flat cut on the other side.

Systems and method of embodiments of the present disclosure create flat wire surfaces on both sides of the cut wire segment, enabling strong and compliant solder joints for Z-axis interconnections in PCBs. In one embodiment, the cutting and gripping mechanism 46 includes two retractable cutters, which are oriented in opposite directions to cut the wire. The dual flush cutting system facilitates a perfect flat cross section cut, thereby enabling copper vertical interconnection. The mechanism 46 further includes a debris removal vacuum device, which removes copper debris thereby providing a solution that can be run in a production environment at high rates.

Figure 5:
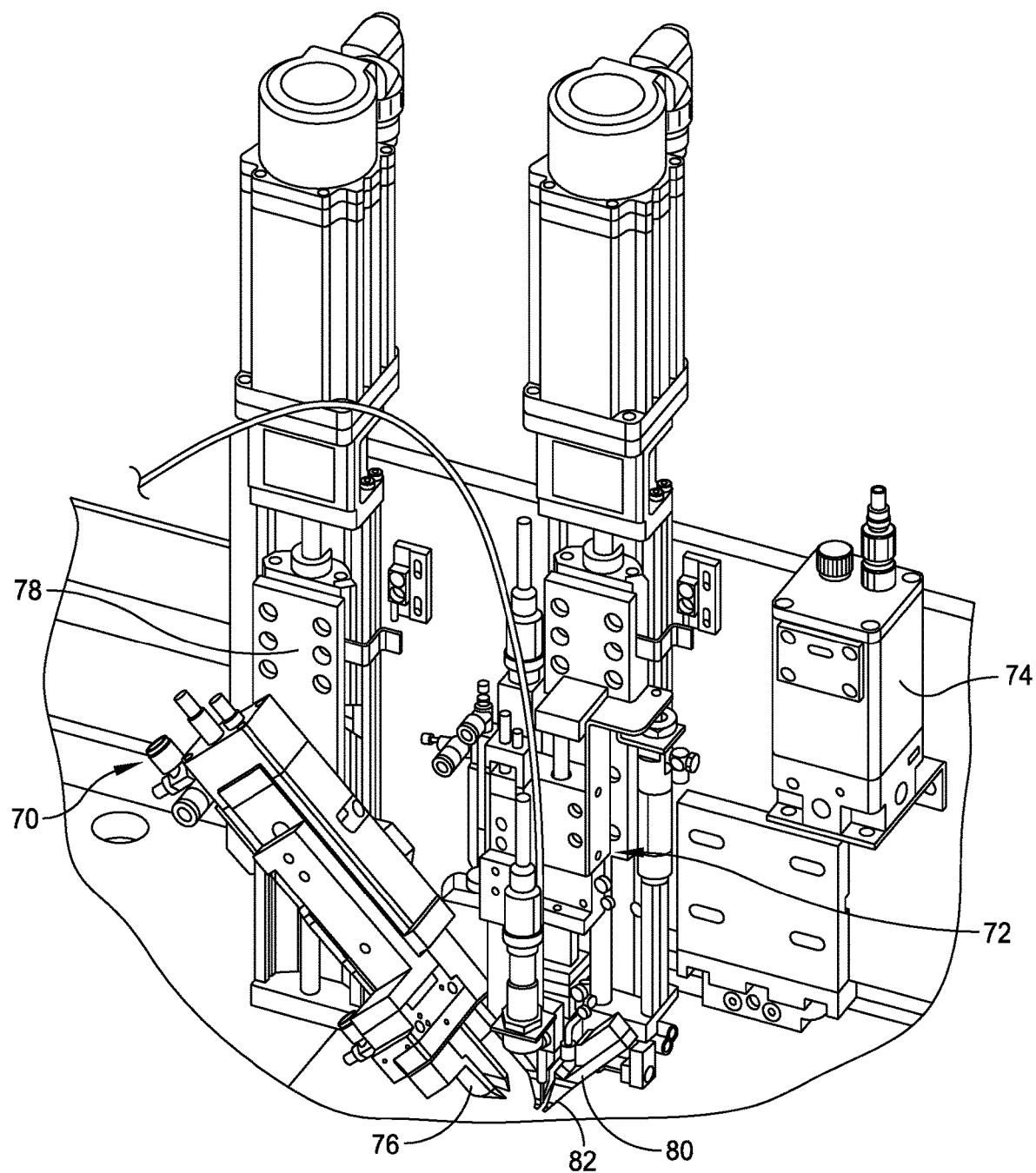
FIG. 5 is a perspective view of a dual wire cutting and gripping mechanism of an embodiment of the present disclosure.
Figure 6:
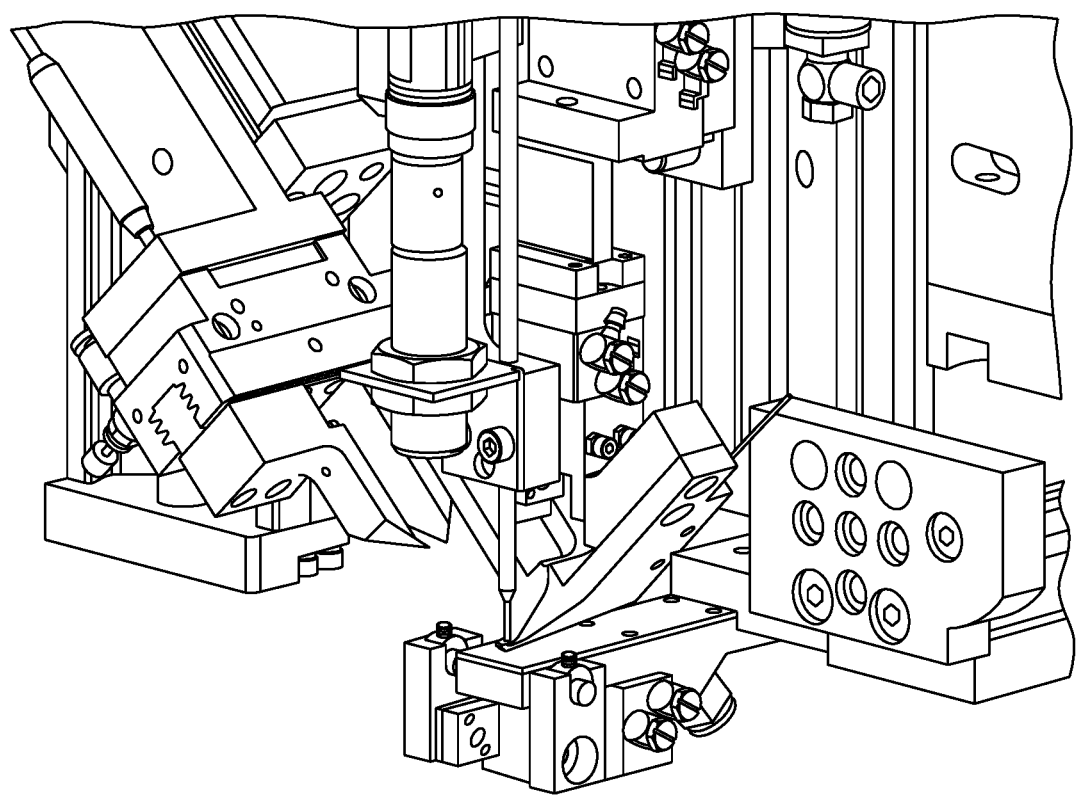
FIG. 6 is an enlarged perspective view of a portion of the dual wire cutting and gripping mechanism.

Referring back to FIG. 3, and additionally to FIGS. 5 and 6, the dual wire cutting and gripping mechanism 46 includes a wire flush cutter assembly, generally indicated at 70, force sensing wire gripper assembly, generally indicated at 72, and a digital precision regulator 74. The wire cutter assembly 70 includes a wire cutter 76 to cut the wire. In one embodiment, the wire cutter 76 is mounted on a slide 78, which is used to position the wire cutter below the wire gripper assembly 72. The wire gripper assembly 72 has a pair of gripper jaws 80 and an inverted wire cutter 82 that are used to grip and cut the copper wire, respectively. The wire feeding and extruding mechanism 42 is used to place the end of the wire into the gripper jaws 80 of the wire gripper assembly 72. The wire is cut by the inverted wire cutter 82 and then retracted into the wire guide 66 of the wire gripper assembly 72, and prepared for insertion into the PCB.

Figure 7A:
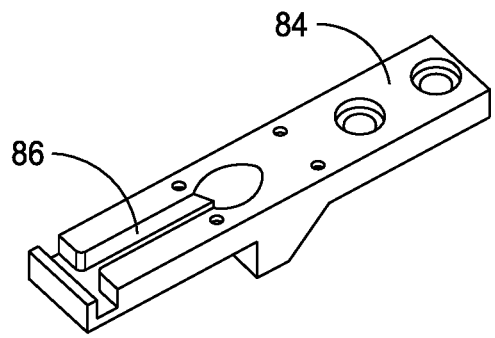
FIGS. 7A and 7B are perspective views of a plenum used to vacuum waste material.
Figure 7B:
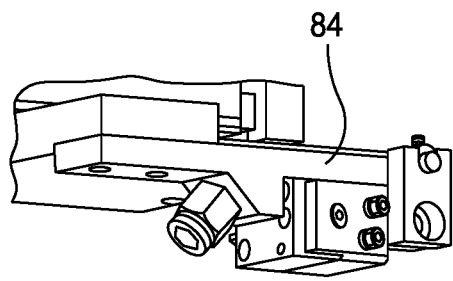

Referring to FIGS. 7A and 7B, the wire gripper assembly 72 includes a vacuum device or plenum 84 that has a channel 86 formed there in to channel waste generated from cutting the wire during a trimming operation. The vacuum device 84 is connected to a vacuum source to provide the suction required to move the waste. The wire cutter 76 is retracted up the slide 78, with the wire cutter of the wire cutter assembly 70 remaining out of the way during the remainder of the insertion process.

Figure 8:
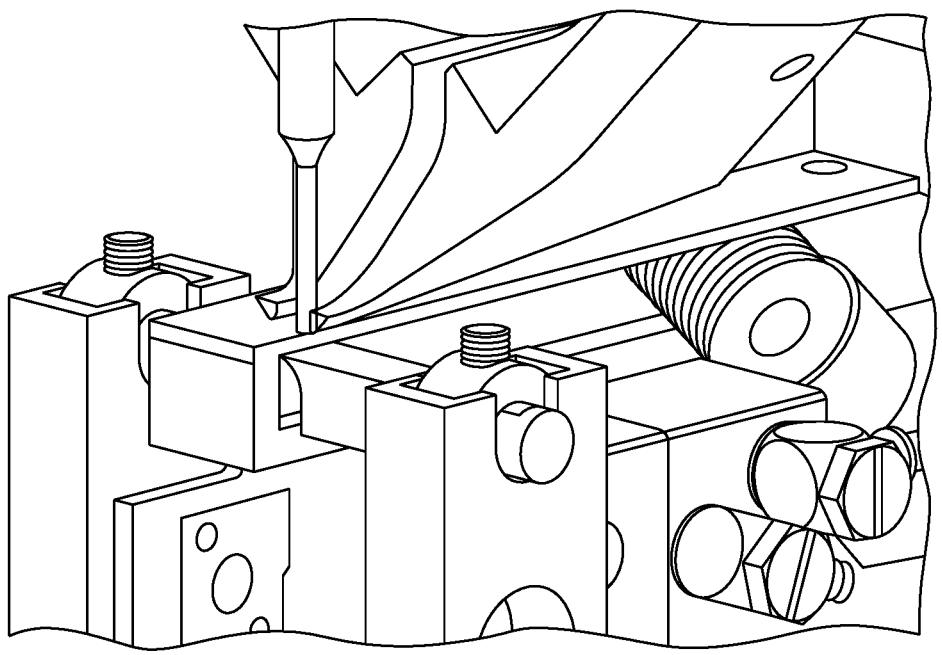
FIG. 8 is an enlarged perspective view of another portion of the dual wire cutting and gripping mechanism.
Figure 9:
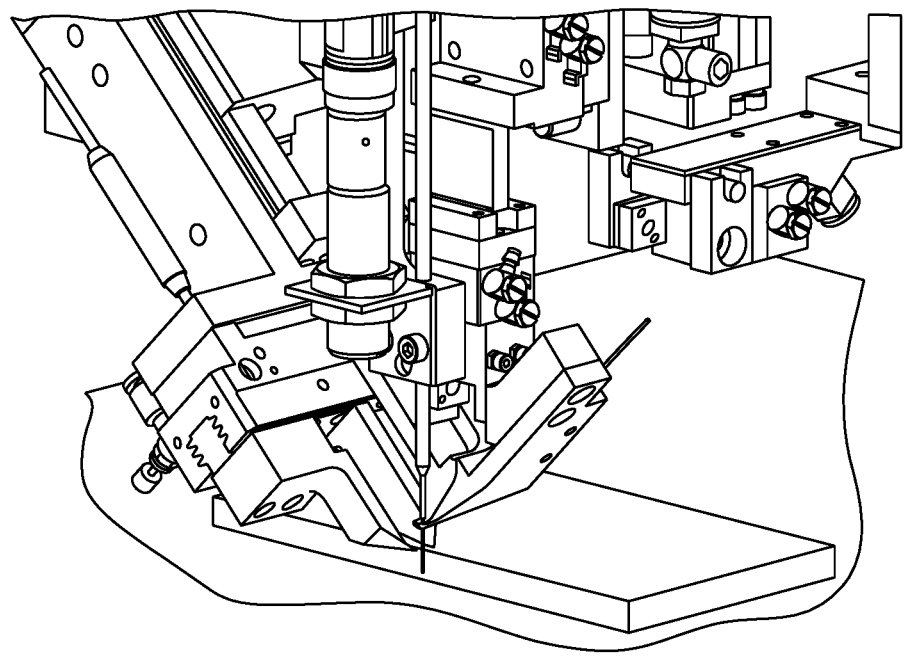
FIG. 9 is an enlarged perspective view of another portion of the dual wire cutting and gripping mechanism.
Figure 10:
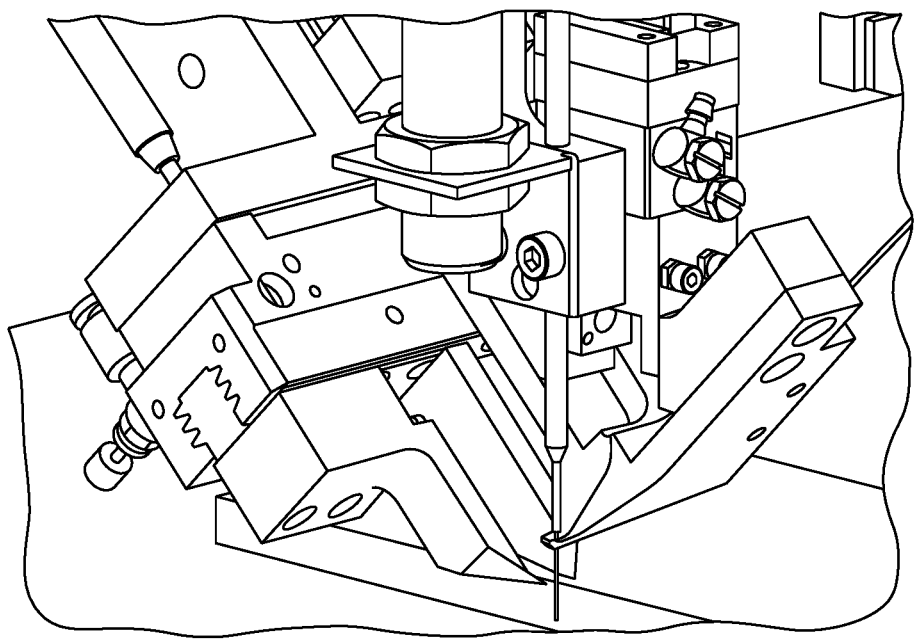
FIG. 10 is an enlarged perspective view of another portion of the dual wire cutting and gripping mechanism.

In one embodiment, as will be described below with reference to the PCB reflow pre-heater 52, the PCB is placed below the wire guide 66 on a heat plate of the PCB reflow pre-heater, which is used to pre-heat the PCB to 250° C. Referring additionally to FIGS. 8-10, the tooling on the wire gripper assembly 72 are all mounted on an inline linear bearing, and gravity sets the tooling at the bottom of the stroke. A low friction cylinder coupled to a digital relieving regulator are used to slowly ramp pressure until tooling ascends on the linear bearing when the weight of the tooling is offset, and the system begins to compress a light buffer spring. When the spring is compressed to a preload (set through experimentation), the regulator is set at that pressure. A magnetic linear encoder is mounted to the carriage to measure the position of the tooling throughout this process, creating a closed loop on the tooling's location.

The wire cutter 76 of the wire cutting assembly 70 and the gripper jaws 80 of the wire gripper assembly 72 descend to their respective locations over the PCB. An ultrasonic sensor is used to position the assemblies at a correct height, and the magnetic linear encoder coupled with a servo axis close the loop for this operation. This analog ultrasonic sensor allows the system to adapt for thermal expansion of the board and other components in real-time. In close proximity to the PCB, copper wire is fed through the wire guide and started into the hole in the PCB. The wire guide is retracted away from the PCB while additional wire is fed. This allows the wire to stay started in the PCB hole, but allow room for gripping the wire by the gripper jaws 80 of the wire gripper assembly 72.

With the wire guide 66 retracted, the gripper jaws 80 of the wire gripper assembly 72 close on the wire and the servo axis descends with the wire into the hole. In one embodiment, the gripper jaws 80 are heated to pre-heat the segment of copper wire being held by the gripper jaws. The gripper jaws 80 are mounted to a low force load cell and is part of a balanced system being held by the buffer spring. As the copper wire makes contact with the solder pad at the bottom of the hole, the buffer spring begins to collapse, and the servo system balances the load applied to the wire while the solder reflow occurs. As the solder reflows, the wire begins descending toward the solder pad on the PCB. The buffer spring begins to unload, and the servo descends further to maintain downward pressure on the wire column. Using the magnetic linear encoder and the load cell the system will develop a force distance curve showing a successful deployment of the wire into the solder bump.

The wire is released by the heated gripper jaws 80 of the wire gripper assembly 72. The slide of the wire cutting assembly 70 is used to bring the custom flush cutter 76 to the wire and the servo axis controls the cut distance from the PCB. The flush cutter 76 closes and cuts the wire. The flush cutter 76 opens, the flush cutter retracts and both servo axis ascend to restart the process. The integrated heating mechanism associated with the gripper jaws, increases the contact surface, thereby improving heat conduction, and eliminating an extra tool. The mechanism 46 combines processes and mechanisms used to automate Z-axis interconnection for volume production.

This approach enables the automated assembly of CVLs into PCBs, and drastically reduces the labor time and costs while increasing the yield and reliability of the connection. In addition, this approach can be modified and made more generic as a system to extrude wire between any two generic locations, not necessarily in a PCB.

The mechanisms of the apparatus 40 can be integrated into an additive manufacturing solution to add the capability of embedding conductive copper wires into 3D printed parts, a concept that is not available on the additive market. Thus, an automated method of extruding and cutting wires at specified lengths, placed anywhere the gantry can reach, is provided, especially for applications for placing wires in PCB applications, mainly for Z-axis interconnections.

Combined with a heating method, the system enables wires to be soldered between any two locations.

Heater Mechanism for Z-Axis Interconnections

Figure 11:
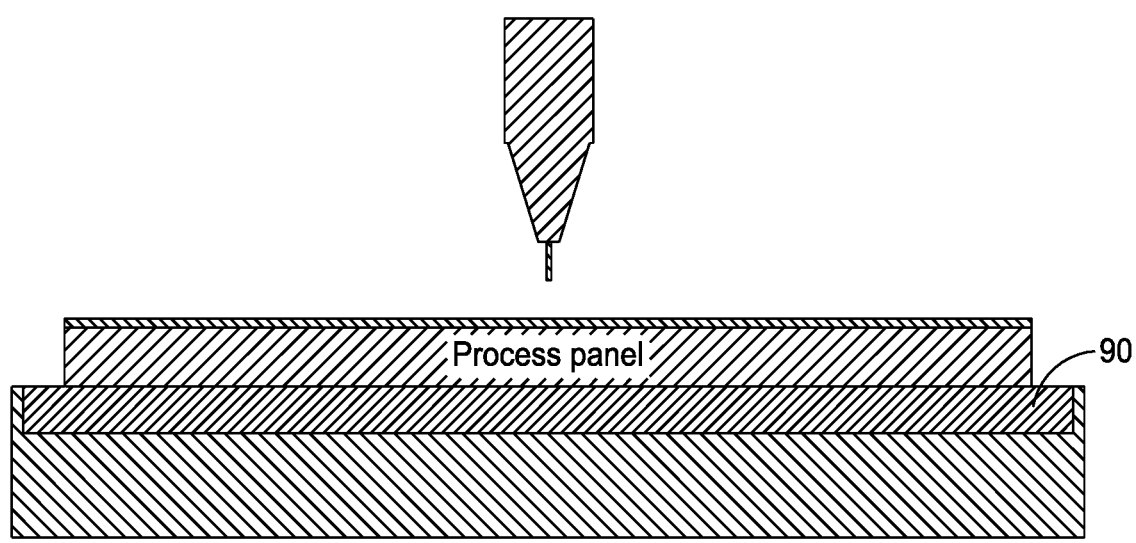
FIG. 11 is a schematic view of a heater mechanism of an embodiment of the present disclosure.

As described above, systems and methods of extruding copper wire to specified lengths, for the purpose of Z-axis interconnections in PCBs is described. In one embodiment, a hole is drilled from the top of the PCB to a pad on an internal layer. The pad is pre-tinned with solder. The wire is inserted and reflowed between the layers. Referring to FIG. 11, in a particular embodiment, the PCB is placed on a hot plate 90 which brings the temperature of the PCB to just under reflow temperature. The wire is driven through a hot end, e.g., a heat block with integrated heating elements associated with the gripper jaws 80 of the wire gripper assembly 72. A tip of assembly is brought to the pre-milled opening, when the wire makes contact with an internally tinned trace the solder reflows. The wire is flush cut as described above and the assembly is moved away from the apparatus. The solder cools and the copper vertical launch interconnection is made within the PCB.

No solution exists that is capable of heating and reflowing wire solder connections. Specifically, there is no known system that is capable of automatically heating a wire to solder the wire to create a Z-axis interconnection in a PCB.

Embodiments of the present disclosure are directed to systems and methods of placing a workpiece on a heated platform to bring the workpiece near (but still under) a solder reflow temperature. Wire is driven through a hot end, e.g., a block of metal with embedded heating elements, PID controlled, which keeps the workpiece high above the reflow temperature. As the wire is driven through the hot end into the pre-milled hole to the internal copper trace, the wire will contact a solder pad on the internal trace and reflow the solder. At this point the wire is flush-cut and the hot-end moves away from the wire to let it cool and solidify.

There doesn't currently exist a solution on the market that is designed for this problem. Embodiments of the apparatus described herein can be configured on a gantry that produces an automated method of fabricating Z-axis interconnections without the plating process. The function of driving a wire through a heated and temperature-controlled heating block for the purpose of soldering wire for PCB interconnects produces superior results.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A method of automating a fabrication of a copper vertical launch within a printed circuit board (PCB), the method comprising:
   feeding copper wire to a wire cutting and gripping mechanism;
   cutting and securing a segment of copper wire;
   inserting the segment of copper wire into a hole formed within the PCB;
   soldering an end of the segment of copper wire to a signal trace of the PCB; and
   flush cutting an opposite end of the segment of the copper wire to a surface of the PCB.

2. The method of claim 1, wherein feeding copper wire includes receiving copper wire from a spool of copper wire.

3. The method of claim 1, further comprising removing waste generated from cutting the copper wire during a trimming operation.

4. The method of claim 3, wherein removing waste includes a vacuum device or plenum that has a channel formed therein to channel waste and a vacuum source to provide a suction required to move the waste.

5. The method of claim 1, wherein feeding copper wire includes guiding the copper wire with a set of pinch rollers configured to pinch or grab the copper wire, and another guide connected to a flexible tube.

6. The method of claim 1, further comprising heating the PCB with a PCB reflow pre-heater mechanism configured to reflow solder once the copper wire is inserted into the hole of the PCB.

7. The method of claim 6, wherein the pre-heater mechanism includes a hot plate configured to raise a temperature of the PCB to just under a reflow temperature.

8. A method of fabricating a copper vertical launch within a printed circuit board (PCB) using an apparatus comprising a feed mechanism configured to feed and extrude copper wire from a spool of copper wire, and a wire cutting and gripping mechanism configured to receive copper wire from the feed mechanism, cut and secure a segment of copper wire, insert the segment of copper wire into a hole formed within the PCB, solder an end of the segment of copper wire to a signal trace of the PCB, and flush cut an opposite end of the segment of the copper wire to a surface of the PCB.

* * * * *